United States Patent
Ise et al.

(10) Patent No.: US 6,806,945 B2
(45) Date of Patent: Oct. 19, 2004

(54) AUTOMATIC EXPOSING APPARATUS AND METHOD FOR EXPOSING BOTH SIDES OF WORKS

(75) Inventors: Masaru Ise, Tokyo (JP); Masaaki Matsuda, Tokyo (JP)

(73) Assignee: Orc Manufacturing Co., Ltd., Tokyo (JP)

( * ) Notice: Subject to any disclaimer, the term of this patent is extended or adjusted under 35 U.S.C. 154(b) by 183 days.

(21) Appl. No.: 09/948,723

(22) Filed: Sep. 10, 2001

(65) Prior Publication Data

US 2002/0036759 A1 Mar. 28, 2002

(30) Foreign Application Priority Data

Sep. 25, 2000 (JP) ...................................... P2000-290709

(51) Int. Cl.[7] .......................... G03B 27/20; G03B 27/32; G03B 27/42; G03B 27/60; G03B 27/64
(52) U.S. Cl. ............................ 355/91; 355/26; 355/53; 355/73; 355/76
(58) Field of Search .............................. 355/26, 53, 72, 355/73, 75, 76, 89, 91, 95, 23, 77

(56) References Cited

U.S. PATENT DOCUMENTS

| | | | | |
|---|---|---|---|---|
| 5,258,808 A | * | 11/1993 | Watanuki | ..................... 355/89 |
| 5,272,502 A | * | 12/1993 | Saiki | ........................... 355/76 |
| 6,198,525 B1 | * | 3/2001 | Barringer et al. | ............. 355/23 |
| 6,211,942 B1 | * | 4/2001 | Okamoto | ..................... 355/26 |

FOREIGN PATENT DOCUMENTS

JP          HEI 7-78630          8/1995

* cited by examiner

*Primary Examiner*—Alan Mathews
(74) *Attorney, Agent, or Firm*—Liniak, Berenato & White (57) ABSTRACT

An automatic both sides exposing apparatus 1 is provided, and includes a first exposing mechanism 10 having a first mask and the second exposing mechanism 20 having a second mask; a carrying-in portion 2 and a carrying-out portion 30; an optical system for exposing the substrate; and a first holder A and a second holder B for holding the substrate and delivering the substrate from the first holder A to the second holder B with reversal of sides at a spot located in an interval between the first and second exposing mechanisms where both holders meet each other. Accordingly, a frequency at which the substrate is delivered is minimized, the substrate can be turned over without the reversing mechanism, the substrate can be transferred (and delivered) at good efficiency in limited space and exposed accurately, any inconvenient origin for the substrate may be minimized, and the apparatus is made compact.

15 Claims, 8 Drawing Sheets

AUTOMATIC EXPOSING APPARATUS AND METHOD FOR EXPOSING BOTH SIDES OF WORKS

BACKGROUND OF THE INVENTION

1. Field of the Invention

The present invention relates to an automatic exposing apparatus for exposing two sides of a work, and a method of exposing thereof, in which a substrate is exposed with a fixed pattern on both sides through respective masks by irradiation with ultraviolet rays.

2. Prior Art

Recently, there have been offered various kinds of automatic exposing apparatus for exposing two sides of a work substrate with a predetermined pattern by irradiation with ultraviolet rays having a fixed wavelength. For example, there is an apparatus to which a substrate transfer mechanism is applied, in which the substrate is transferred by a handler that moves in coming and going directions, and that provides suction pads for holding the substrate. There is also another transfer mechanism in which the substrate is transferred by a driving roller or a driving belt, on which the substrate is mounted.

In such apparatus, the substrate is exposed on both sides after aligning each side thereof. Generally, this method comprises first exposing the substrate on one side, then reversing or turning over the substrate from its upper surface to its under surface by a reversing device provided in the substrate transfer route, and again, exposing the substrate on another side which is transferred by the substrate transfer mechanism.

In addition, there are various constructions of the light source mechanism. In each, the optics reference (such as a reflector, fly-eye-lens, or cooling mechanism and the like) must be arranged in the inside of the apparatus and it is necessary to secure the substrate transfer route and the substrate transfer mechanism.

Accordingly, as for the current automatic exposing apparatus for exposing a work on two sides, the constitution is extremely complicated.

SUMMARY OF THE INVENTION

However, as for the current automatic exposing apparatus said above, there is room for improvement, and to solve the problem as follows.

(1) The current automatic exposing apparatus for exposing on two sides of a work (or called "automatic both side exposing apparatus" as follows) described above has a substrate transfer mechanism including a handler, a carrying-out roller, and the like devices. An increased number of such devices are provided in the route for delivering the substrate. In the case of each serial process, devices are provided for the substrate transfer, the aligning, the exposing and the like. It becomes necessary to secure both a delivery space and a delivery time. The need for adequate delivery space and time increases the opportunity for dust to stick to the substrate. It is desirable, therefore, to provide a constitution for holding the delivering movement of the substrate in check and to a minimum.

(2) As for the current automatic both side exposing apparatus described above, since the substrate transfer mechanism thereof is complicated, and moreover, a reverse constitution for allowing the substrate turn over is provided separately, the size of the whole assembly is enlarged and raises an inconvenience inasmuch as a sufficient area is needed for the assembly.

(3) There is a constitution of the automatic both sides exposing apparatus using the collimator reflecting light as parallel light indicated here by Japanese Patent Examined Publication No.1995-78630, and, according to the constitution, the collimator reflecting system is to be put and arranged between two substrates. However, due to said above constitution, in order to expose the substrate on both sides, it is required to provide the reversing device to reverse or turn over the substrate from its upper surface to its under surface. Also, it is required for the handler to deliver the substrate to another printing frame. Consequently, the reversing device and handler expand the size of the apparatus, as mentioned above.

In view of the forgoing problems, the present invention is suggested.

An object of the present invention is to provide an automatic exposing apparatus for exposing a work on two sides wherein a frequency that the substrate is delivered is minimized, where the substrate can be turned over without a reversing mechanism, where the substrate can be transferred (and delivered) at good efficiency in limited space and exposed accurately, where any inconvenient origin for the substrate is able to be minimized, and where the apparatus is made compact.

According to the present invention, there is an automatic exposing apparatus for exposing a work substrate having first and second sides provided, which comprises a first exposing mechanism having a first mask, a second exposing mechanism having a second mask, a carrying-in portion from which the work substrate is delivered to the first exposing mechanisms, a carrying-out portion for the substrate to which the work substrate is delivered from the second exposing mechanism, a first holder for closely fixing the work substrate and placing the first side of the work substrate in contact with the first mask so that the first side faces the first exposing mechanism, a first optical system, a second holder for closely fixing the work substrate and placing the second side of the work substrate in contact with the second mask, and a second optical system.

Further, the first holder and the second holder respectively have first and second holding means to hold the substrate, and a place for delivering the substrate is provided, to which each of the first exposing mechanism and the second mechanism is opposite respectively. The substrate is delivered to the second holder from the first holder, wherein the substrate is turned over from upper surface to under surface.

With the constitution mentioned above, as to the automatic both sides exposing apparatus according to the present invention, each of the first and the second holders thereof serve not only as a printing frame but also as the substrate reversing or turning over device.

Furthermore, the first holder of the automatic both sides exposing apparatus is movable, while holding the substrate, over a first driving course that is made from said carrying-in portion by the first exposing mechanism to said delivering place of the substrate.

The second holder is movable, while holding the substrate, over a second driving route that is formed from the delivering place of the substrate by the second exposing mechanism to said carrying-out portion.

With the construction made in this way, as to the automatic both sides exposing apparatus, there is the substrate provided, which is not only transferred from the carrying-in portion to the carrying-out portion by the first and the second holders, but also, turned over from upper surface to under surface by the same and exposed by the first and the second exposing mechanisms that collaborates with the first and the second holders, respectively.

Furthermore, as to said holding means for the substrate of the automatic both sides exposing apparatus, there is provided a negative adsorbing mechanism such as a vacuum suction mechanism or an adsorption mechanism based on Bernoulli theorem, in which the substrate is supported tight or held in the holder by the negative pressure.

The first exposing mechanism and the second exposing mechanism of the automatic both sides exposing apparatus each comprises a transparent plate holding said mask, an alignment mechanism, in which the transparent plate is moved so as to match a position of the mask to that of the substrate, a supporting frame mechanism holding the alignment mechanism, and a working mechanism, which can let the supporting frame move in the direction of the substrate.

In this way, in each of the first exposing mechanism and the second exposing mechanism, it is possible that the mask remain stuck to or near contact with the substrate by virtue of said working mechanism, and that a gap of a position between the substrate and the mask is confirmed and an alignment of the mask and the substrate is to be performed, and the substrate is able to be exposed in accordance with the mask.

Moreover, the automatic both sides exposing apparatus further comprises a holding side sliding mechanism, in which one of the first holder and the second holder at least slides or moves the substrate held by said holding means in the direction of the other holder.

With the constitution made in this way, slipping or positional deviation of the substrate is minimized, when it is slid or moved, and there are more transfer or driving routes of the substrate to be prepared.

Furthermore, at least one of the first holder and the second holder has a moving loci in the shape of rectangle, which is made of two straight long lines and two short straight lines. Also, the first and second holders are to meet each other in one of the short straight lines for delivering of the substrate. With this structure, since the first holder and the second holder can move and operate independently in each driving route respectively, shortening of the tact time is possible, and the efficiency can work well.

Moreover, each of the holders comprises a circulation moving mechanism for moving the holders. The circulation moving mechanism comprises a supporting arm holding one of the both holders respectively, a move control body having a supporting arm and a carrying rail for moving the first holder or the second holder through a respective one of the moving control bodies.

As constituted in this way, each of the holders moves fast along the rail, while the substrate remains in good position.

Besides, the optical system may comprise a collimator reflecting mirror arranged outside the position at which the substrate is exposed, provided that the position is determined as "inside".

With the construction built in this way, by joint work of both exposing mechanisms and both holders, it is possible to expose the substrate on two sides at higher efficiency.

Furthermore, according to another important object of the present invention, there is a method of exposing the substrate on two sides suggested, which comprises first for the substrate to be delivered to the first holder in the carrying in portion, for the first holder to be moved to an exposing treating position while holding the substrate and to be stopped there, for the first exposing mechanism to be advanced before the substrate and for the substrate to be stuck on a first mask held by a first transparent plate, for an alignment of the first mask and the first side of the substrate to be performed, due to confirming the positional difference between the first mask and the substrate through a camera, for the first side of the substrate to be exposed on through the first mask by parallel light from a first collimator reflecting mirror.

The method further comprises, subsequently, for the adsorption between the substrate and the mask to be released, for the substrate held by the first holder to be faced at the second holder moved from an (evacuation) position at which the second holder has taken refuge and for each of the sides of the substrate to be stuck on each of the holders respectively, wherein one holder moves at least in direction of each other, so that for the substrate to be delivered from the first holder to the second holder with the face and the back exchanged.

Furthermore, after the first holder has delivered the substrate, the first holder is permitted to be moved in the direction of the carrying-in portion, while the second exposing mechanism is slid to the substrate held by the second holder and a second mask held on a second transparent plate is stuck on the substrate. After confirming the positional difference between the mask and the substrate by camera, for the alignment to be performed, the second side that is aligned of the substrate is exposed by parallel light reflected on the second collimator reflecting mirror through the second mask of the second exposing mechanism. After the coherence with the substrate and second mask is removed, the substrate held by the second holder is moved in the carrying-out portion, where the substrate is taken out.

Owing to the mentioned above constitution, the frequency at which the substrate is delivered to the first and second holders is minimized, and the face and back of the substrate can be exposed.

DESCRIPTION OF THE PREFERRED EMBODIMENT

Referring now to a preferred embodiment, this invention will be described in further detail with reference to the accompanying drawings.

Figure 1:
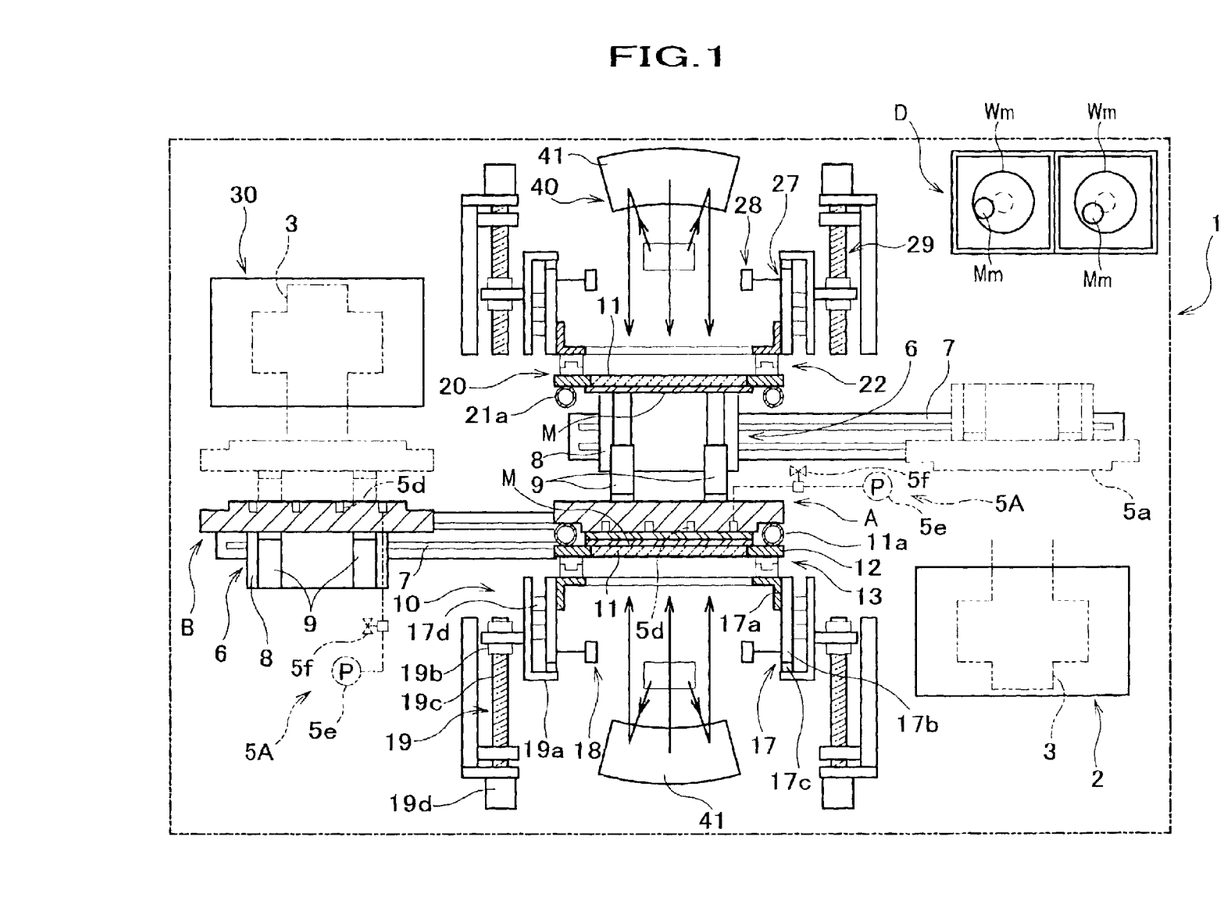
FIG. 1 is a general view, partly in cross section, of an automatic exposing apparatus for exposing a work on two sides according to an embodiment of the present invention.

FIG. 1 is a general view, partly in cross section, of an automatic exposing apparatus for exposing a work on two sides according to an embodiment of the present invention.

As shown in FIG. 1, an automatic exposing apparatus for exposing a work 1 comprises a carrying-in portion 2 for a substrate W, a first holder A having a first driving means by which the substrate W is conveyed or transported from the carrying-in portion 2 and a first holding means for the substrate, a first exposing mechanism 10 in which one of the sides of the substrate W is exposed in conjunction with the first holder A, a second holder B to which the substrate W is delivered from the first holder A, after the substrate W has been exposed on the one side thereof, the second holder B also having a second driving means for the substrate W, a second exposing mechanism 20 in which the other side of the substrate W is exposed in conjunction with the second holder B, and a carrying-out portion 30, in which the substrate W is carried out after exposing the substrate W on two sides.

Described below is an automatic exposing apparatus for exposing a work on two sides 1 of the present invention, particulary for the case that there is the substrate W lain perpendicularly and transported or exposed as it is.

Figure 5A:
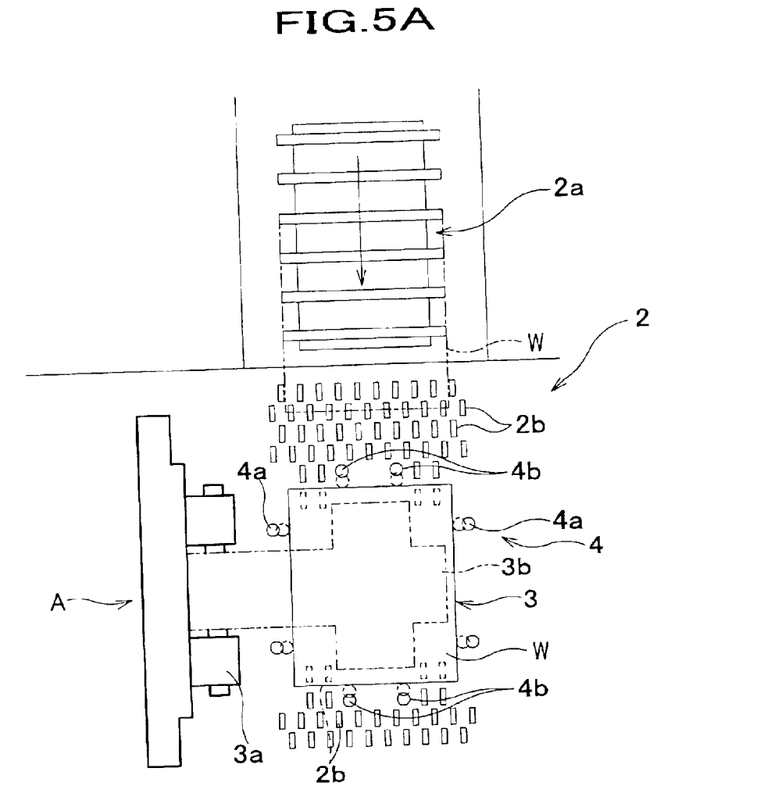
FIG. 5(a) and FIG. 5(b) are respectively a side elevation view and a plan view showing a construction of the carrying-in portion according to an embodiment of the present invention.

As for the carrying-in portion 2, as shown in FIG. 5 (a), there is the substrate W entered into said apparatus 1 through a carry-in roller 2a. The substrate W is sent by a sending roller 2b, and located preparatorily in collaboration with preliminarily locating pins 4a, 4b of a preparative locating mechanism 4. Then, owing to a transfer means 3, the substrate W is adsorbed fixedly and transferred to the first holder A.

Figure 5B:
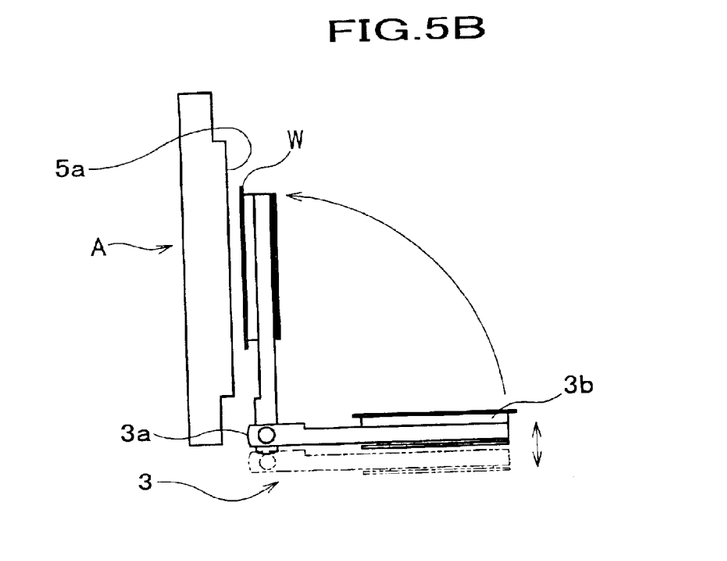

As shown in FIG. 5(a) and FIG. 5(b), the transfer means 3 has an adsorption arm 3b arranged to stand under the level of the sending roller 2b that supports the substrate. As mentioned above, when the preliminary positioning is performed, the adsorption arm 3b raises to the level of the substrate W and then the adsorption arm 3b holding the substrate W fixedly turns around an ascent and descent axis part 3a in order to transfer the substrate W to the first holder A as stands by the place.

Referring to FIG. 1 and FIGS. 2(a)–2(c), the first holder A and the second holder B are now described. Because the second holder B is the same in mechanism as the first holder A, as a principle only the first holder A is explained below.

Figure 2A:
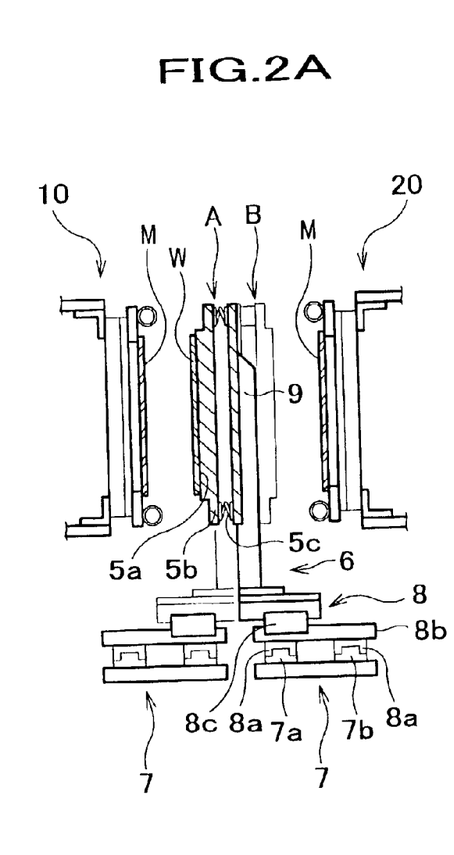
FIGS. 2(a), 2(b) and 2(c) depict a step-by-step change of location of both a first holder A and a second holder B in a place where exposing treatment is performed according to an embodiment of the present invention.
Figure 2B:
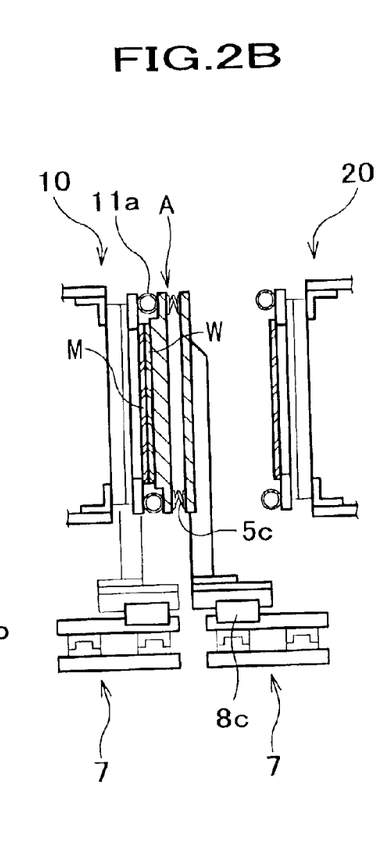
Figure 2C:
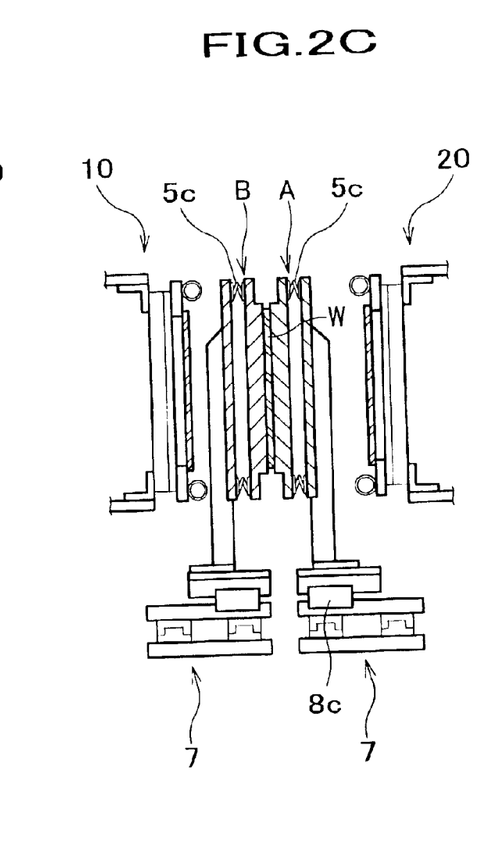

As for the first holder A, there is a sucking mechanism 5A provided, which comprises a suction side 5a having a plurality of sucking holes 5d for absorbing the substrate W fixedly, a vacuum pump 5e, which is connected to said suction side 5a through a leak valve 5f, or the like. And in the suction mechanism 5A the substrate W does not cause transformation at all due to the suction mechanism 5A in spite of thickness of the substrate.

Moreover, as shown in FIGS. 2(a)–2(c), as for the first holder A, there is a spring 5c provided, in order to moderate a shock at receiving the substrate.

As to the holder A, there is proposed a first driving route R1 as a route of moving locus thereof, which is arranged between the carrying-in portion 2 and an exposing section which includes the first exposing mechanism 10 and the second exposing mechanism 20.

Due to a circulation moving mechanism 6 formed along the route, the first holder A holding the substrate W can move along the route.

As for the second holder B, there is a second driving route R2 proposed, which is arranged between the exposing section which includes both the first and the second exposing mechanisms 10, 20 and the carrying-out portion 30.

In addition, the substrate W is delivered from the first holder A to the second holder B at a place in the exposing section, particularly now in the second exposing mechanism.

A part of the routes overlap each other. This overlapping part corresponds to a part included in common by both short straight lines R1b and R2b (as will be seen later, referring to FIGS. 6(a)–(c) and FIGS. 7(a)–(c)).

As shown in FIG. 1 and FIGS. 2(a)–2(c). the circulation moving mechanism 6 comprises: a carrying rail 7; a moving body 8 which moves along the carrying rail 7; and a supporting arm 9, which is supported by the moving body 8 and supports the first holder A, wherein a carrying rail 7 includes a driving rail 7a equipped with a drive motor such as a servomotor (not shown) for moving the moving body 8 in accuracy, and a slave rail 7b.

The moving body 8 comprises: an engagement portion 8a, with which the carrying rails 7a and 7b are engaged; a moving support table 8b, under which the engagement portions 8a, 8a are formed fixedly; and a sliding mechanism 8c formed on the moving support table 8b.

The sliding mechanism 8c has a driving motor (not shown) and permits the moving support table 8b to move along in the direction perpendicular to that allowed by the carrying rail 7.

There is no holder trembling while moving along the route because it is held up by the supporting-arm 9.

Referring to FIGS. 6(a)–(c) and FIGS. 7(a)–(c), the first driving route R1 or a moving locus of the first holder A comprises: two straight long routes R1a, R1c which correspond respectively to a route between the carrying-in portion 2 and the first exposing mechanism 10, and to a route between the second exposing mechanism 20 and the carrying-in portion 2; and two straight short routes R1b, R1d which correspond respectively to a route in the exposing section that includes both exposing mechanisms 10 and 20, and to a route in the carrying in portion, so that the first driving route R1 appears shape of rectangle.

While, as for the second holder B, there is the second driving route R2 or a moving locus thereof suggested, which comprises: two straight long routes R2a, R2c which correspond respectively to a route between the carrying-out portion 30 and the first exposing mechanism 10, and to a route between the second exposing mechanism 20 and the carrying-out portion 30; and two straight short routes R2b, R2d which correspond respectively a route in the exposing section that includes both exposing mechanisms 10 and 20, and to a route in the carrying out portion, so that the second driving route R2 appears shape of rectangle.

Referring to FIG. 1, as to the first exposing mechanism 10 and the second exposing mechanism 20, because the latter is the same in construction as the former, as a principle only the former is explained.

As shown in FIG. 1, the first exposing mechanism 10 comprises: a transparent plate 11 holding a mask M; a frame 12 supporting the transparent plate 11; an aligning mechanism 13, in which the frame 12 is not only supported perpendicularly but also is moved for location in the direction of X, Y and θ; a support frame mechanism 17 which supports the frame 12 through the aligning mechanism 13; and an actuating mechanism 19 which moves the support frame mechanism 17 in order to let the transparent plate 11 shift its position in front and in rear.

Figure 3A:
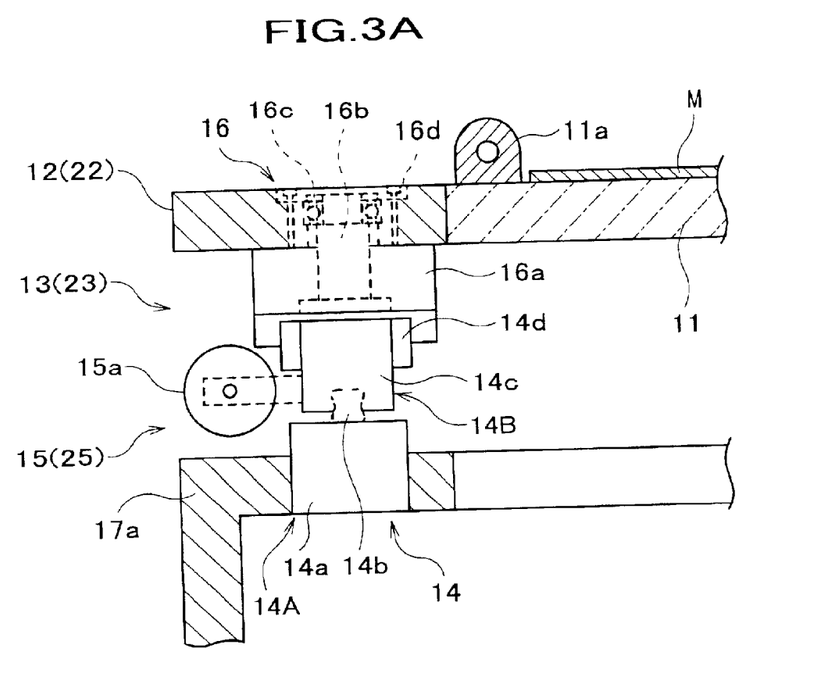
FIG. 3(a) and FIG. 3(b) are respectively a sectional view and a plan view to show a matching or aligning mechanism that is common to both the first exposing mechanism and the second exposing mechanism according to an embodiment of the present invention.
Figure 3B:
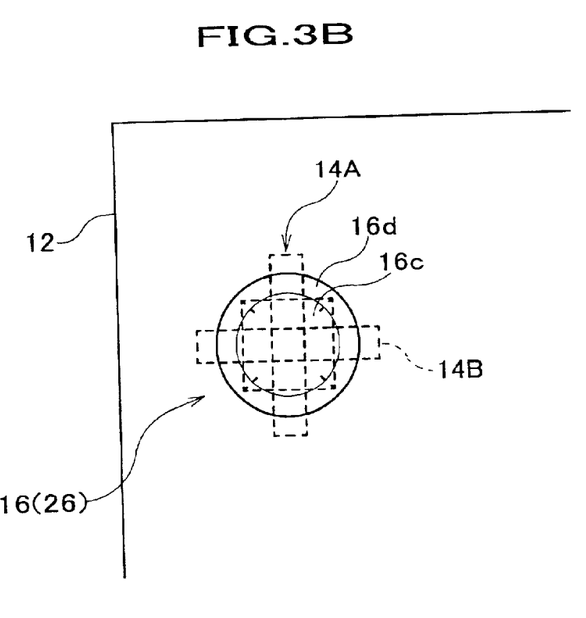
Figure 4:
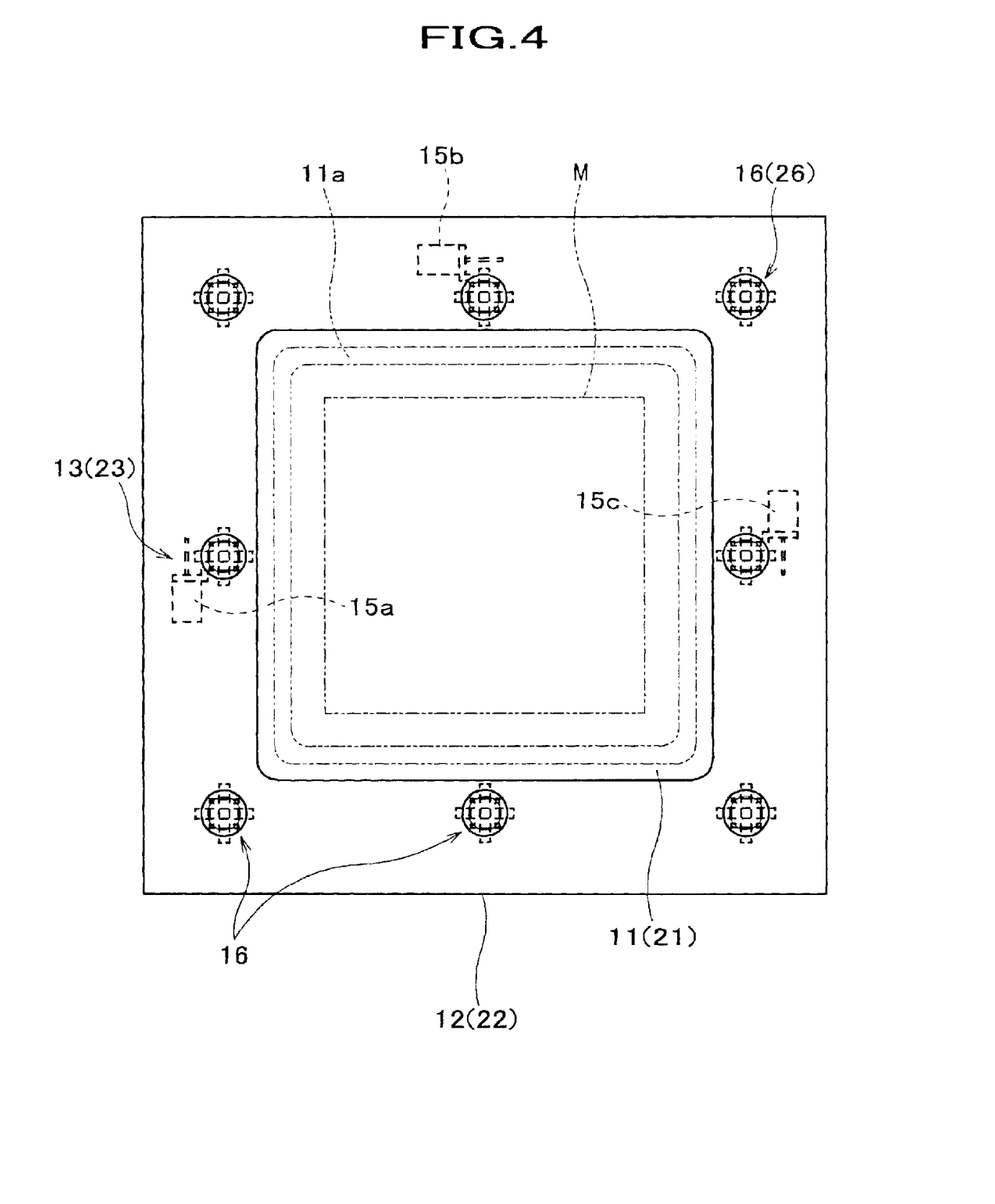
FIG. 4 is a plan view showing the whole of a transparent plate for the exposing mechanism A or B according to an embodiment of the present invention.

As for the transparent plate 11, as shown in FIGS. 3(a) and 3(b) and FIG. 4, there is a seal rubber 11a provided with in its edge side around, together with which there is a space formed around the mask and the substrate when the mask and the substrate come in contact. Owing to handling absorption in the space, a vacuum contact of the mask and the substrate is performed significantly fixedly.

The frame 12 and a hold frame 17a of the support frame mechanism 17 are connected to each other through aligning mechanism 13, which comprises: a rail guide 14, along which the frame 12 is moved in the direction of X and Y; a driving motor 15, by which the frame 12 is allowed to move for aligning with the mask and the substrate; and a roll supporting part 16, by which the frame 12 moved for alignment is supported in location.

As to the rail guide 14, as shown in FIGS. 3(a) and 3(b) and FIG. 4, there are provided both a rail for X direction 14A which consists of a base portion for moving in direction of X 14a and a guide for X direction 14b, and a rail for Y direction 14B which consists of a base portion for moving in direction of Y 14c and a guide for Y direction 14d. Each of the guides 14b and 14d is formed to permit the frame 12 to move or slide along the rail while the guide is engaged with the rail.

Furthermore, as shown in FIG. 4, as to the driving motor 15, there are three motors (a first(15a), a second(15b) and a third(15c)) which are respectively arranged at each center of three edges of the frame 12, provided that either of the first motor 15a and the third motor 15c moves the base portion for moving in direction of Y 14c or the frame 12 along the guide for X direction 14b, and that the second motor 15b moves the frame 12 along the guide for Y 14d.

Accordingly, due to appropriate actuating control of the plurality of driving motors 15, the frame 12 is allowed to move in the direction of X, Y and θ.

As to a device for moving the frame 12 in the direction of X, Y and θ, as shown in FIGS. 3(a) and 3(b), there is provided the roll supporting portion 16 inside and around the frame 12. The roller support portion 16 comprises: a base terminal portion 16a; a roll spindle 16b which is arranged inside of the base terminal portion 16a; a rolling portion 16c which serves as a bearing of the roll spindle 16b; and a roll accepted part 16d, which is formed at the inner part of the frame 12 and supports the roll portion 16c with free turn and is connected fixedly to the outer part thereof.

As shown in FIG. 1 and FIGS. 3(a) and 3(b), the support frame mechanism 17 supporting the frame 12 through the aligning mechanism 13 comprises: the hold frame 17a which holds the base portion for moving in the direction of X 14a; a moving base 17b, which supports the hold frame 17a; a spring part 17c which is arranged on the bottom side of the support frame mechanism 17, through which the moving base 17b is supported by the actuating mechanism 19; and sliding support portion 17d which is supported by a holding portion 19a of the actuating mechanism 19 to slide freely.

In addition, the actuating mechanism 19 has a supporting part 19b which supports fixedly the holding portion 19a and a screwed portion 19c which moves the supporting part 19b and a control motor 19d in order to move the screwed portion 19c by rotating.

As shown in FIG. 1, there is a camera 18 for taking a photograph of locating marks Mm and Wm when a vacuum suction of the mask M and the substrate W is performed. The camera 18 is equipped at an affixed place (for example, a cover frame side, the support frame mechanism 17 and the like) with move free in the direction of X, Y through a move mechanism (not shown) such as a rail or like.

Accordingly, when an exposing operation is performed, the camera 18 can move from the light field to avoid causing trouble for the exposing step.

A picture of those locating marks Mm and Wm that is taken by the camera 18 is shown on a monitor display D in order that a worker may watch it directly. Image information obtained by the camera 18 is utilized to control an aligning operation of the aligning mechanism 13.

Further, as shown in FIG. 1, first and second optical systems 40 are provided. The first and second optical systems 40 are arranged on opposite sides of the first exposing mechanism 10 and the second exposing mechanism 20, respectively. Light respectively guided through each of reflectors, flyeye lens or the like (not shown) generated from a light source (not shown) is led to a collimator reflector 41, 41, each of which is arranged on a respective outer side of a respective one of the exposing mechanisms 10 and 20.

Accordingly, parallel light reflected on the collimator 41, 41 irradiates in the exposing mechanisms 10 or 20, respectively.

As to the carrying-out portion 30, as shown in FIG. 1, there are a sending roller (not shown) and a transfer means 3 provided, each of which corresponds to the same included in the carrying-in portion 2.

Accordingly, the substrate is taken out from the second holder B in the carrying-out portion 30 and sent to the next stage.

The operation of an automatic exposing apparatus for two sides of a work is described as follows.

As shown in FIG. 5(a), first a substrate W entered into the apparatus 1 through a carry in roller 2a is sent up to fixed position by a sending roller 2b and is left there.

Then, to stop the substrate W, a preparative locating mechanism 4 of the carrying-in portion 2 is actuated and the substrate W is pushed from four sides by preparative locating pins so as to locate preparatorily.

As shown in FIG. 5(b), after the preparative locating, an adsorption arm 3b in a transfer means 3 rises and the substrate W is delivered from the sending roller 2b to a sucking side of the adsorption arm 3b. The adsorption arm 3b holding the substrate W is turned round by an ascent and descent axis part 3a and the substrate W is transferred to a first holder A.

Figure 6A:
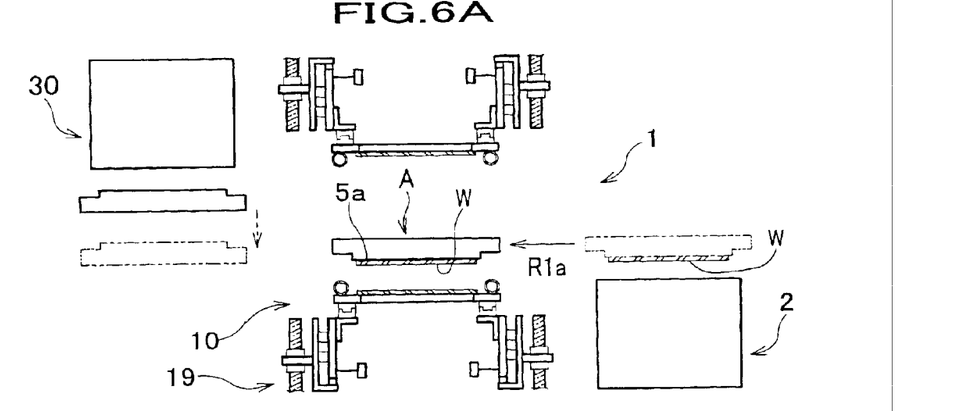
FIGS. 6(a), 6(b) and 6(c) show a step-by-step procedure for exposing the substrate according to an embodiment of the present invention.

As shown in FIG. 6(a), the first holder A holding the substrate W first moves up to the front of a first exposing mechanism 10 along the straight long route R1a of a first driving route R1 and stops there.

Figure 6B:
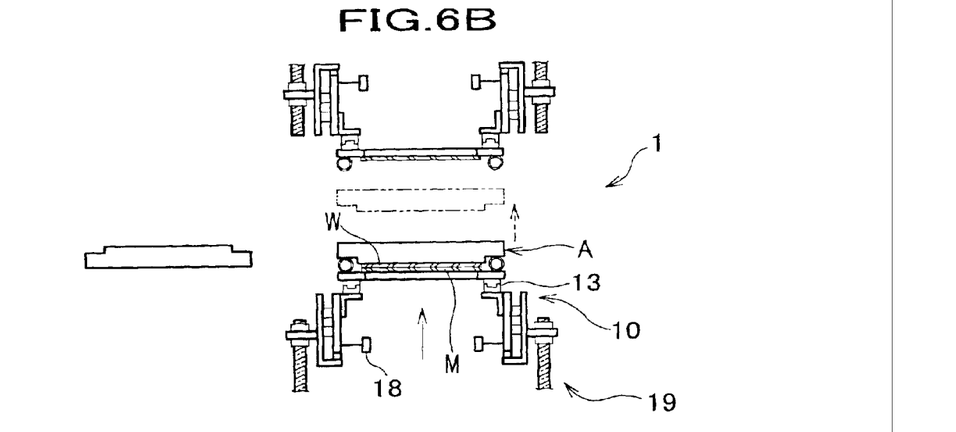

As shown in FIG. 6(b) and FIG. 2(b), while the first holder A is stopped there, a mask M held on a transparent plate 11 is moved in the direction of the substrate W by an actuating mechanism 19 of the first exposing mechanism 10.

Thereupon, it is possible to utilize a constitution that the first holder A and the first exposing mechanism 10 come up to each other. Here, for moving the first holder A, there is a sliding mechanism 8c provided. (See to FIG. 2(b))

And now, owing to a spring part 17c as well as a spring 5c, the mask M and the substrate W make close contact with each other under conditions in whiche the shock has been moderated.

Furthermore, in case of their contact, there is a space formed around the mask and the substrate through a seal rubber 11a. Due to sucking air in the space by a vacuum mechanism (not shown), a vacuum contact of the mask and the substrate is performed.

Then, a photograph that shows both locating marks of the substrate and the mask as Wm and Mm respectively is taken by a camera 18. If it is necessary to perform aligning with the substrate W and the mask M, the alignment is performed by an aligning mechanism 13 under condition that the vacuum contact is released to separate the substrate W and the mask M from each other.

As shown in FIG. 4, when the mask M is allowed to move only in the direction of X, the alignment is performed by actuating the first motor 15a and/or the third motor 15c, which lie opposite to each other in the frame 12. If it is necessary to move for aligning in the direction of Y or θ the alignment is performed by actuating one of the first motor 5a and the third motor 15c at least and the second motor 15b.

According to the apparatus 1 of the present invention, after the alignment step is finished, the substrate W and the mask M contact each other again, then under the vacuum contact, alignment accuracy is confirmed by the camera 18. When the alignment accuracy is in tolerance for error, the camera 18 is removed away and an exposing step starts by using ultraviolet rays with fixed wavelength.

Figure 6C:
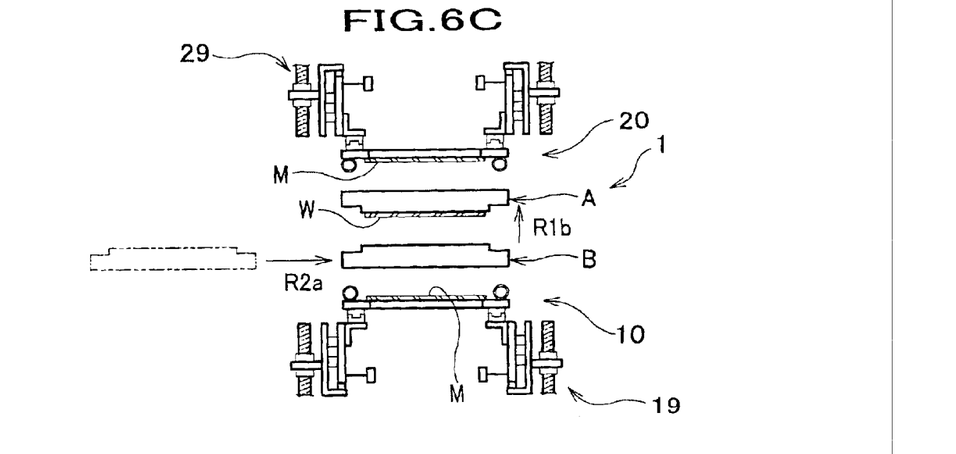

After the exposing step is performed, as shown in FIG. 6(c), the vacuum contact is released, and the first exposing mechanism 10 is moved back by an actuating mechanism 19. The first holder A is slid holding the substrate W along a straight short line R1b by a sliding mechanism 8c. (See FIGS. 2(a)–2(c))

At this moment, there is a second holder B that is watched and waiting for by the side of a carrying-out portion 30. The second holder B is moved along a straight long route R2a by a circulation moving mechanism 6. The second holder B stops at a front of the first exposing mechanism 10 and faces the first holder A.

Figure 7A:
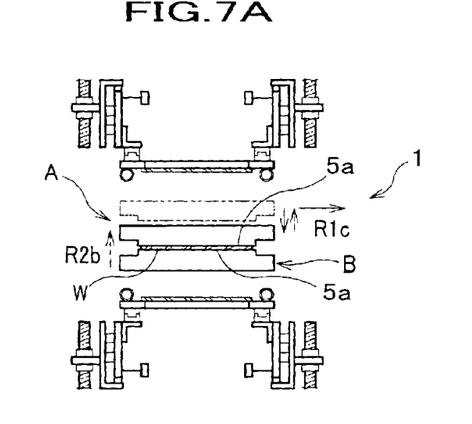
FIGS. 7(a), 7(b) and 7(c) show a step-by-step procedure for exposing the substrate according to an embodiment of the present invention.

As shown in FIG. 7(a), as for the apparatus 1 of the present invention, just before the substrate W is stuck on both suction sides 5a, 5a of the first holder A and the second holder B, respectively, either or both of the first and the second holders are slid by the sliding mechanisms 8c.

Subsequently, the back of the substrate W is exchanged for the face of the substrate W, wherein operation of the suction side 5a of the first holder A is exchanged for that of the suction side 5a of the second holder B.

As mentioned above, both holders A and B are provided with a respective spring 5c in order to moderate the sock as the suction side 5a comes into contact with the substrate W.

In accordance with this construction, owing to the sucking performance, the substrate W is delivered from the first holder A to the second holder B with a reversal of sides (from the front to the back) so that a difference in location of the substrate W can be maintained to the minimum.

Figure 7B:
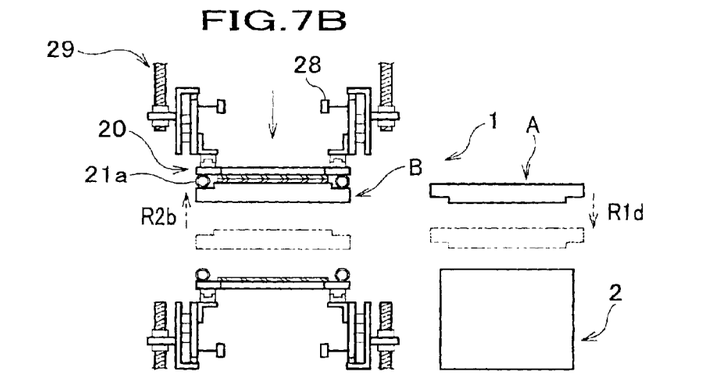

As shown in FIGS. 7(a) and 7(b), the first holder A which has delivered the substrate W not only slides back in the direction of the second exposing mechanism 20 side by the sliding mechanism 8c, but also moves along the straight long route R1c *to the carrying-in portion 2*.

The second holder B that has been delivered the substrate W slides forward (in the same direction) along a straight short route R2b and stops at preliminary point.

When the second holder B stops there, the second exposing mechanism 20 moves forward to stick a second mask M on the substrate W.

Furthermore, upon contact of the mask M and the substrate W, there is a space formed around the mask and the substrate through a seal rubber 21a. Due to sucking air from the space by a vacuum mechanism (not shown), a vacuum suction of the mask and the substrate is performed.

Moreover, a difference of both locations of the mask M and the substrate W are confirmed in a photograph taken by a camera 28.

If the difference is not within tolerance for this alignment, the aligning work is performed again with an aligning mechanism 23 in the same way as described referring to FIG. 6(b), then after an aligning accuracy is confirmed, exposing work is performed.

Figure 7C:
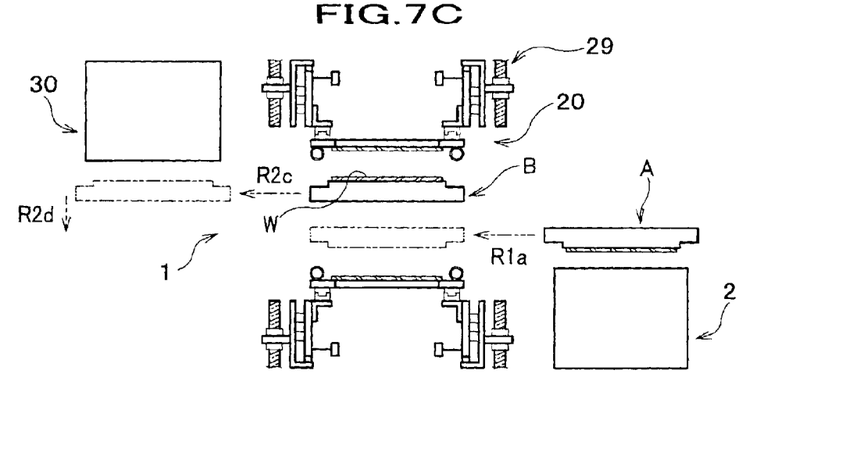

At this moment, as shown in FIG. 7(c), the first holder A is transferred a new substrate in the carrying-in portion 2, and moves to the front of the first exposing mechanism 10. Thereafter, the above-described movements are repeated, which is shown in FIG. 6(a)–FIG. 7(b).

As for the first holder A holding the new substrate, there is a space still maintained, enough to move it up to the front of the first exposing mechanism 10, when both of the second holder B and the second exposing mechanism 20 perform an exposing work jointly.

The substrate W finished by exposing its two sides is moved, while being held by the second holder B, along the straight long route R2c up to a carrying out portion 30, to which the substrate W is transferred through a transfer means 3, and is sent out to a next stage.

The second holder B is moved along a straight short route R2d through a sliding mechanism 8c and stands ready to receive another substrate in collaboration with the first holder A and the first exposing mechanism 10 when the exposing work of the first holder A and the first exposing mechanism 10 is finished.

And owing to movements shown in FIG. 6(b)–FIG. 7(c), repeating exposure of the substrate W is performed.

Accordingly, since the substrate W is moved as it is held on both the first and the second holders A and B during move from the carrying-in portion 2 to the carrying-out portion 30, delivery frequency of the substrate becomes a minimum.

Figure 8A:
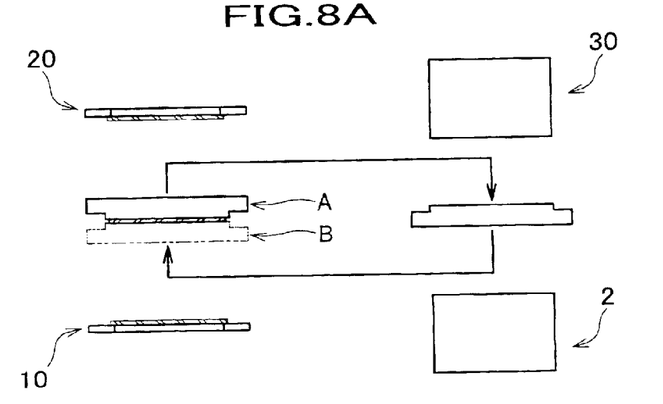
FIGS. 8(a), 8(b) and 8(c) show the drive route provided in an automatic exposing apparatus for exposing a work on two sides according to an embodiment of the present invention.
Figure 8B:
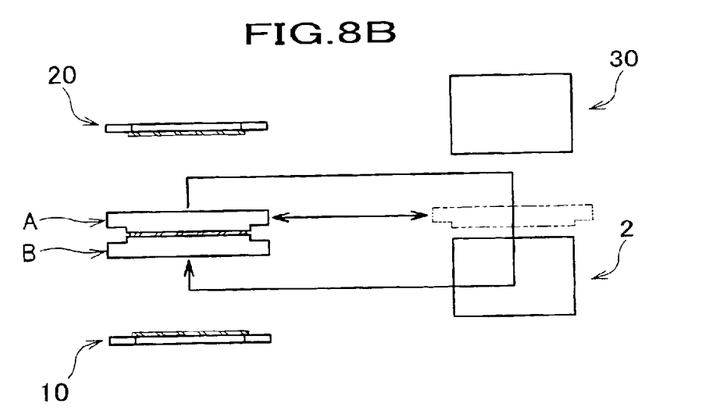
Figure 8C:
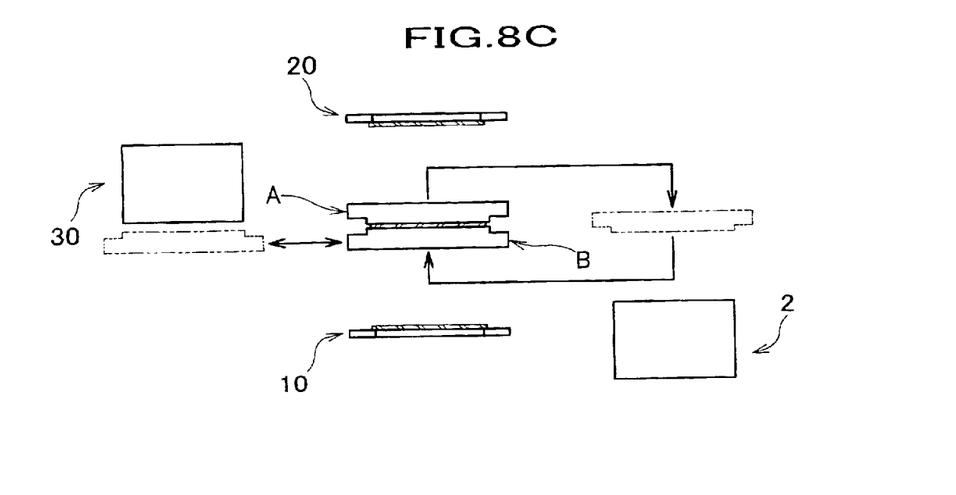

As to both driving routes R1 and R2 of respective holders A and B, FIGS. 8(b) and 8(c) show respectively a route formed in the form of a rectangle and another route formed in the shape of a straight line as coming and going routes (not shown except for arrow).

Due to this constitution, and to the same holders A and B, as well as the same exposing mechanisms 10 and 20, delivery or transfer frequency of the substrate during the two-side exposure process also becomes a minimum.

Since either of the driving lines R1 and R2 is in shape of the straight line as mentioned above, as for the exposing mechanisms 10 and 20, a movement distance to the substrate is controlled, which is respectively both that to front and to the rear are more extended.

As for the present apparatus 1, if relative positions of the carrying-in portion 2 and the carrying-out portion 30 are arranged shown in FIGS. 8(a) and 8(b), it is useful for workers to perform the maintenance thereof.

According to this apparatus of the present invention, though the substrate is moved and exposed with the perpendicular, if it is moved and exposed with the horizontal, there is no transfer means 3.

Furthermore, as for the present apparatus, because there is a preliminary locating mechanism provided in the carrying-in portion, the aligning work of the aligning mechanism is performed in haste and precisely.

In addition, as to this apparatus of the present invention, there is no need to provide a device for traversing the substrate, so that a compact apparatus can be obtained.

As to a holding means, with which a holder of this invention holds the substrate, a vacuum suction, an adsorption mechanism based on Bernoullior theorem like as a negative adsorbing method, and mechanical holding method are able to be put in use.

Furthermore, as for close contact of the mask and the substrate when in aligning or in exposing the substrate, vacuum suction is not limited as a contact method therefore. For example, a proximity method or system can be of use.

Accordingly, this invention produces the following superior effects.

(1) As for the automatic both side exposing apparatus, by joint work of the first holder and the second holder, which serve as a printing frame and a turning over mechanism, and that of the first exposing mechanism and the second exposing mechanism, both sides of the substrate are exposed, so that the delivering movement of the substrate can be reduced.

Therefore, the opportunity for dust to stick to the substrate is lowered, and the exposure can handle the substrate smartly, so that the yield efficiency of the substrate can improve.

And, at the time the substrate is turned over/delivered, aligning work by the second exposing mechanism can be performed quickly because the exposing work of one side of the substrate has already been completed.

(2) As for the automatic both sides exposing apparatus, the first holder and/or the second holder maintain their hold of the substrate for the period of sending in the carrying in portion to the carrying-out portion, and the substrate is handled with movement, exposure and turn over.

Therefore the automatic both sides exposing apparatus can do the delivering or transfer frequency of the substrate in minimum time.

(3) Because each holder of the automatic both sides exposing apparatus possesses a negative adsorption means, the apparatus can be used for substrates of various kinds of thickness.

(4) The first exposing mechanism and the second exposing mechanism of this apparatus each moves in the direction of the substrate by appropriate timing when the substrate is laid before a predetermined exposure handling position. Accordingly, the serial operation of a sending/conveyance of the substrate, an aligning work, an exposure handling and a carrying out/conveyance can be handled efficiently.

(5) The automatic both sides exposing apparatus provides a suction side movement method as the sliding mechanism in at least one of the holders A and B, by which the suction side stuck the substrate can be moved or slid forward or back in the direction of the substrate. Consequently, it is possible to form many arrangements about the move or slide distance or the like thereof.

Accordingly, it is possible to establish a combination of routes for both holders A and B by various forms.

(6) The first holder and the second holder of the automatic both sides exposing apparatus are each provided with at least one driving route formed in shape of rectangle. It is only in case of performing the delivery of the substrate that both holders meet each other and perform joint work. The first holder and the second holder may act freely independently for smart exposure, and the operation may occur with good efficiency.

(7) Both holders of the automatic both sides exposing apparatus can be permitted to move along the driving route by circulation moving mechanisms having rail conveying both holders.

Accordingly, the conveyance state of the substrate can be done with a vertical course, and can be done with a horizontal direction thereof.

(8) The automatic both sides exposing apparatus provides an exposing position for the substrate which is established inside of the collimator reflecting mirrors arranged around the position thereof, so that the delivery efficiency of the substrate by both holders can be (9) Because it is not necessary to use a handler for delivering the substrate and there is not a turning over work manufacturing process, according to this both sides exposing method, the delivering movement or frequency of the substrate can be suppressed to a minimum, adhesion of dust to the substrate is decreased, transformation of the substrate or delivering mistakes can be held in check and to minimum, and miniaturization of the apparatus and the prime cost thereof can be reduced.

What is claimed is:

1. An automatic exposing apparatus for exposing a work substrate having first and second sides, the automatic exposing apparatus comprising:
    a first exposing mechanism having a first mask;
    a second exposing mechanism having a second mask;
    a carrying-in portion for providing the work substrate to said first exposing mechanism;
    a carrying-out portion for receiving the work substrate from said second exposing mechanism;
    a first holder for closely fixing the work substrate thereto and placing the first side of the work substrate in contact with the first mask so that the first side of the work substrate faces said first exposing mechanism;
    a first optical system for exposing the first side of the work substrate when the work substrate is closely fixed to said first holder and in contact with the first mask;
    a second holder for closely fixing the work substrate thereto and placing the second side of the work substrate in contact with the second mask so that the second side of the work substrate faces said second exposing mechanism; and
    a second optical system for exposing the second side of the work substrate when the work substrate is closely fixed to said second holder and in contact with the second mask,
    wherein at least one of said first holder and said second holder is movable directly towards the other of said first holder and said second holder, and wherein said first and second holders are movable to simultaneously contact the work substrate.

2. An automatic exposing apparatus according to claim 1, wherein said first holder comprises a first holding means for holding the work substrate in such a manner that the first side faces said first optical system and the second side-faces away from said first optical system, and said second holder comprises a second holding means for holding the work substrate in such a manner that the second side faces said second optical system and the first side faces away from said second optical system.

3. An automatic exposing apparatus according to claim 2, wherein said first holding means comprise a first negative absorbing mechanism for holding the work substrate by negative pressure and said second holding means comprise a second negative absorbing mechanism for holding the work substrate by negative pressure.

4. An automatic exposing apparatus according to claim 2, wherein:
said first exposing mechanism comprises a first transparent plate for holding the first mask, a first alignment mechanism in which said first transparent plate is located to match positioning of the first mask and the work substrate on said first holder, a first supporting frame mechanism holding said first alignment mechanism, and a first working mechanism for moving said first supporting frame mechanism toward the work substrate when on said first holder; and
said second exposing mechanism comprises a second transparent plate holding the second mask, a second alignment mechanism in which said second transparent plate is located to match positioning of the second mask and the work substrate on said second holder a second supporting frame mechanism holding said second alignment mechanism and a second working mechanism for moving said second supporting frame mechanism toward the work substrate when on said second holder.

5. An automatic exposing apparatus according to claim 2, further comprising a holding side sliding mechanism for sliding the work substrate, when held by at least one of said first holder and said second holder, from said first exposing mechanism to said second exposing mechanism.

6. An automatic exposing apparatus according to claim 2, wherein at least one of said first holder and said second holder each comprises a loci moving over a rectangular path having two straight long lines and two straight short lines, including a place along one of the straight short lines at which said first and second holders meet one another.

7. An automatic exposing apparatus according to claim 2, further comprising:
a first circulation moving mechanism for moving said first holder, said first circulation moving mechanism comprising a first supporting arm holding said first holder, a first move control body having said first supporting arm, and a first carrying rail on which said first move control body is mounted for movement; and
a second circulation moving mechanism for moving said second holder, said second circulating moving mechanism comprising a second supporting arm holding said second holder, a second move control body having said second support arm, and a second carrying rail on which said second move control body is mounted for movement.

8. An automatic exposing apparatus according to claim 2, further comprising a first collimator reflecting mirror and a second collimator reflecting mirror, wherein said first and second exposing mechanisms each are positioned between said first collimator reflecting mirror and said second collimator reflecting mirror.

9. An automatic exposing apparatus for exposing a work substrate having first and second sides, the automatic exposing apparatus comprising:
a first exposing mechanism having a first mask;
a second exposing mechanism having a second mask;
a carrying-in portion for providing the work substrate to said first exposing mechanism;
a carrying-out portion for receiving the work substrate from said second exposing mechanism;
a first holder for closely fixing the work substrate thereto and placing the first side of the work substrate in contact with the first mask so that the first side of the work substrate faces said first exposing mechanism;
a first optical system for exposing the first side of the work substrate when the work substrate is closely fixed to said first holder and in contact with the first mask,
a second holder for closely fixing the work substrate thereto and placing the second side of the work substrate in contact with the second mask so that the second side of the work substrate faces said second exposing mechanism;
a second optical system for exposing the second side of the work substrate when the work substrate is closely fixed to said second holder and in contact with the second mask; and
a holding side sliding mechanism for sliding the work substrate, when held by at least one of said first holder and said second holder, from said first exposing mechanism to said second exposing mechanism.

10. An automatic exposing apparatus according to claim 9, wherein said first holder comprises a first holding means for holding the work substrate in such a manner that the first side faces said first optical system and the second side faces away from said first optical system, and said second holder comprises a second holding means for holding the work substrate in such a manner that the second side faces said second optical system and the first side faces away from said second optical system.

11. An automatic exposing apparatus according to claim 10, wherein said first holding means comprise a first negative absorbing mechanism for holding the work substrate by negative pressure and said second holding means comprise a second negative absorbing mechanism for holding the work substrate by negative pressure.

12. An automatic exposing apparatus according to claim 10, wherein:
said first exposing mechanism comprises a first transparent plate for holding the first mask, a first alignment mechanism in which said first transparent plate is located to match positioning of the first mask and the work substrate on said first holder, a first supporting frame mechanism holding said first alignment mechanism, and a first working mechanism for moving said first supporting frame mechanism toward the work substrate when on said first holder; and
said second exposing mechanism comprises a second transparent plate holding the second mask, a second alignment mechanism in which said second transparent plate is located to match positioning of the second mask and the work substrate on said second holder, a second supporting frame mechanism holding said second alignment mechanism; and a second working mechanism for moving said second supporting frame mechanism toward the work substrate when on said second holder.

13. An automatic exposing apparatus according to claim 10, wherein at least one of said first holder and said second holder each comprises a loci moving over a rectangular path having two straight long lines and two straight short lines including a place along one of the straight short lines at which said first and second holders meet one another.

14. An automatic exposing apparatus according to claim 10, further comprising:

a first circulation moving mechanism for moving said first holder, said first circulation moving mechanism comprising a first supporting arm holding said first holder, a first move control body having said first supporting arm, and a first carrying rail on which said first move control body is-mounted for movement; and a second circulation moving mechanism for moving said second holder, said second circulation moving mechanism comprising a second supporting arm holding said second holder, a second move control body having said second support arrn, and a second carrying rail on which said second move control body is mounted for movement.

15. An automatic exposing apparatus according to claim 10, further comprising a first collimator reflecting mirror and a second collimator reflecting mirror, wherein said first and second exposing mechanisms each are positioned between said first collimator reflecting mirror and said second collimator reflecting mirror.

* * * * *